(12) United States Patent
Chen et al.

(10) Patent No.: US 12,550,778 B2
(45) Date of Patent: Feb. 10, 2026

(54) SEMICONDUCTOR PACKAGE AND METHOD OF FORMING THE SAME

(71) Applicant: Taiwan Semiconductor Manufacturing Company, Ltd., Hsinchu (TW)

(72) Inventors: Wei-Chih Chen, Taipei (TW); Yu-Hsiang Hu, Hsinchu (TW); Hung-Jui Kuo, Hsinchu (TW); Po-Han Wang, Hsinchu (TW); Hung-Chun Cho, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 448 days.

(21) Appl. No.: 18/181,556

(22) Filed: Mar. 10, 2023

(65) Prior Publication Data

US 2024/0304511 A1  Sep. 12, 2024

(51) Int. Cl.
| | |
|---|---|
| *H01L 23/31* | (2006.01) |
| *H01L 21/56* | (2006.01) |
| *H01L 21/683* | (2006.01) |
| *H01L 23/48* | (2006.01) |
| *H01L 23/544* | (2006.01) |

(52) U.S. Cl.
CPC .......... *H01L 23/3157* (2013.01); *H01L 21/56* (2013.01); *H01L 23/481* (2013.01); *H01L 23/544* (2013.01); *H01L 2223/54426* (2013.01)

(58) Field of Classification Search
CPC ... H01L 23/3157; H01L 21/56; H01L 23/481; H01L 23/544; H01L 2223/54426; H01L 21/561; H01L 21/568; H01L 21/6836; H01L 23/3128; H01L 2221/68345; H01L 2221/68359; H01L 2221/68372; H01L 2221/68381; H01L 2223/54406; H01L 2223/5442; H01L 2223/54433; H01L 2223/54486; H01L 21/6835
See application file for complete search history.

(56) References Cited

U.S. PATENT DOCUMENTS

2015/0270247 A1\* 9/2015 Chen .................... H01L 25/105
257/737

\* cited by examiner

*Primary Examiner* — Herve-Louis Y Assouman
(74) *Attorney, Agent, or Firm* — JCIPRNET

(57) ABSTRACT

A semiconductor package and a method of forming the same are provided. The semiconductor package includes a semiconductor die and a redistribution structure disposed on the semiconductor die. The redistribution structure includes an alignment auxiliary layer, a plurality of dielectric layers and a plurality of conductive patterns. The alignment auxiliary layer has a light transmittance for a light with a wavelength range of about 350-550 nm lower than that of one of the plurality of dielectric layers.

20 Claims, 11 Drawing Sheets

SEMICONDUCTOR PACKAGE AND METHOD OF FORMING THE SAME

BACKGROUND

In recent years, the semiconductor industry has experienced rapid growth due to continuous improvement in integration density of various electronic components and reduction in minimum feature sizes, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1I are schematic cross-sectional views illustrating structures through processes of a manufacturing method of a semiconductor package in accordance with some embodiments of the present disclosure.

DETAILED DESCRIPTION

Figure 1A:
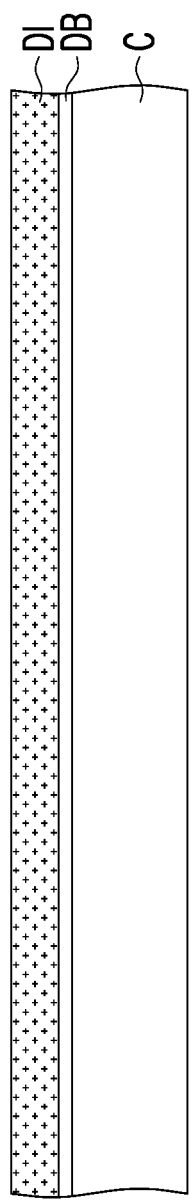

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and a method of forming the same are provided. In accordance with some embodiments of the present disclosure, the semiconductor package has a semiconductor die, an encapsulant laterally encapsulating the semiconductor die, a redistribution structure disposed on the encapsulant and on the semiconductor die, and bumps disposed on the redistribution structure. The redistribution structure comprises at least one alignment auxiliary layer. The alignment auxiliary layer is semi-opaque or translucent and has a transmittance lower than 50% under the light of the wavelength range of 350-550 nm. The alignment auxiliary layer is colored and includes at least one colorant or dye. With the alignment auxiliary layer formed within the redistribution structure, precise alignment for conductive terminals or bumps can be achieved. As the alignment auxiliary layer is semi-opaque, the interference or background noise caused by the underlying bright metallic patterns may be lessened or lowered, which significantly enlarges the alignment window and improves the production yields. Further, by using the alignment auxiliary layer, precise alignment is achieved with a correctness rate higher than 80% or as high as 91%.

In accordance with some embodiments of the present disclosure, embodiments discussed herein are to provide examples to enable making or using the subject matter of this disclosure, and a person having ordinary skill in the art will readily understand modifications that can be made while remaining within contemplated scopes of different embodiments.

FIG. 1A to FIG. 1I are schematic cross-sectional views illustrating structures through processes of a manufacturing method of a semiconductor package in accordance with some embodiments of the present disclosure.

Referring to FIG. 1A, a carrier C having a de-bonding layer DB and a dielectric layer DI formed thereon is provided. The de-bonding layer DB is disposed on the carrier C and located between the carrier C and the dielectric layer DI. In some embodiments, the carrier C is a temporary carrier. In one embodiment, the carrier C includes a bulk semiconductor wafer such as a silicon wafer or a silicon-on-insulator (SOI) wafer. In one embodiment, the carrier C includes a glass carrier, and the de-bonding layer DB is a light-to-heat conversion (LTHC) release layer formed over the glass carrier. In some alternative embodiments, the de-bonding layer DB may be a photo-curable release film whose stickiness is decreased by a photo-curing process or a thermal curable release film whose stickiness is decreased by a thermal-curing process. In some embodiments, the material of the dielectric layer DI is or includes polyimide (PI), polybenzoxazole (PBO) or a suitable polymeric dielectric material. In some embodiments, the dielectric layer DI is a colored dielectric layer including colorants or dyes.

Figure 1B:
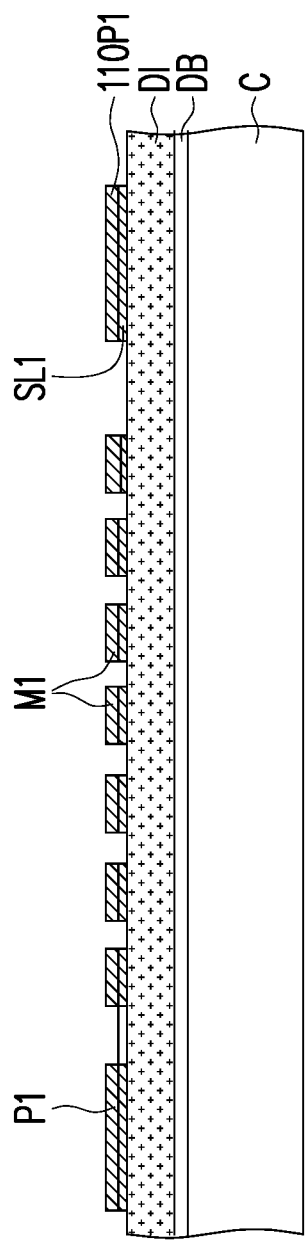

Referring to FIG. 1B, a conductive pattern 110P1 is formed on the dielectric layer DI. In some embodiments, the conductive pattern 110P1 includes routing traces M1 and pads P1. In some embodiments, the conductive pattern 110P1 includes a seed layer SL1 located on the dielectric layer DI. As an example, the formation of the conductive pattern 110P1 involves forming a seed layer (not shown) over the dielectric layer DI, then forming a metallic material layer (not shown) over the seed layer, and patterning the seed layer and the metallic material layer with a mask pattern to form the conductive pattern 110P1 and the seed pattern SL1. In some embodiments, the seed layer may be a single layer or a composite layer comprising a plurality of sub-layers formed of different materials. In some embodiments, the seed layer includes a titanium/copper composite layer formed by, for example, physical vapor deposition (PVD) or chemical vapor deposition (CVD). In some embodiments, the metallic material includes copper, titanium, nickel, tungsten, aluminum, a combination thereof. In some embodiments, the metallic material layer is formed by electroless plating, electroplating or deposition. The seed pattern will not be illustrated in the following figures for simplicity.

Figure 1C:
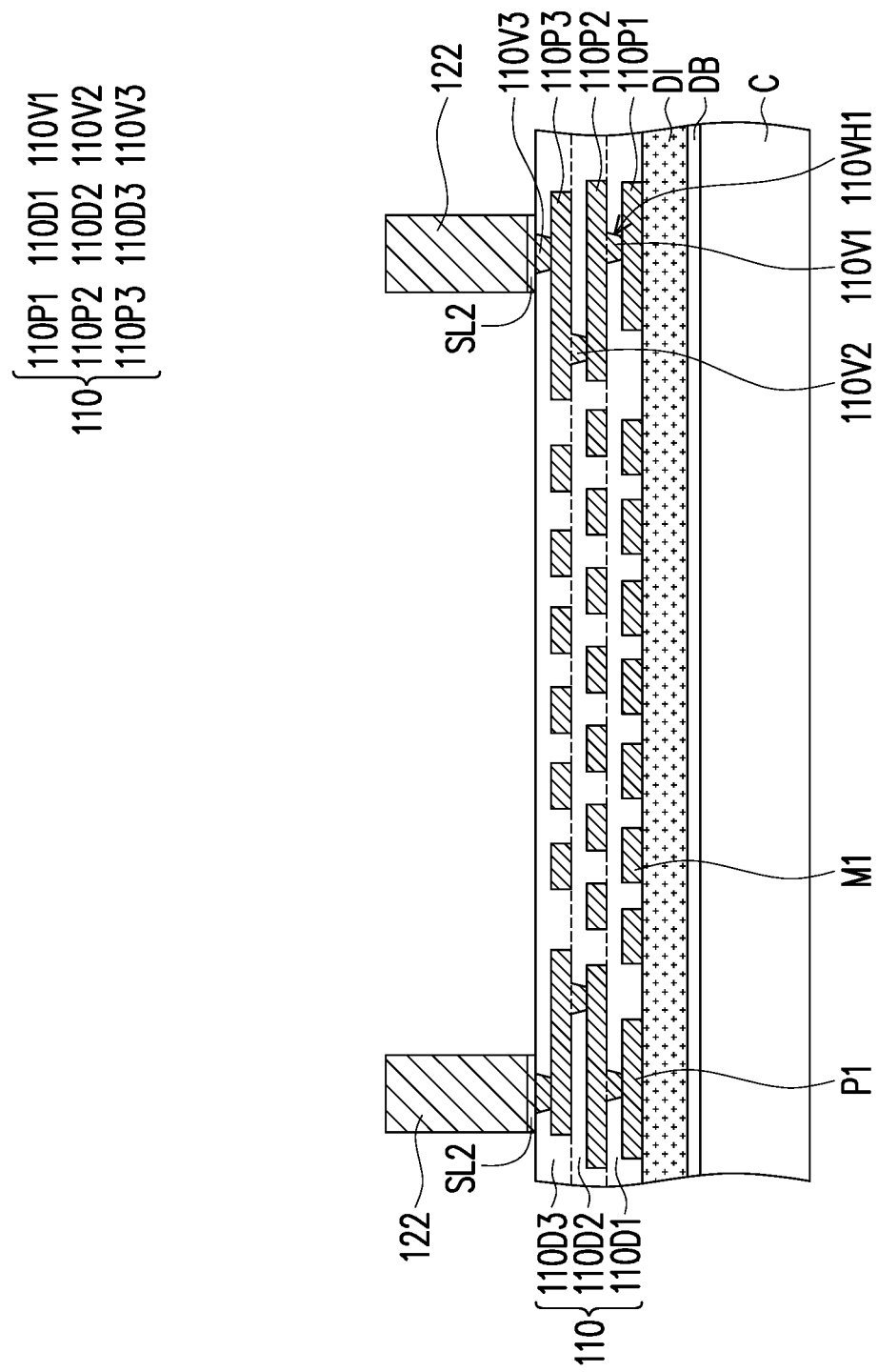

Referring to FIG. 1C, following the formation of the conductive pattern 110P1, a dielectric layer 110D1 is formed on the conductive pattern 110P1 and over the dielectric layer DI. In some embodiments, the dielectric layer 110D1 is formed of a polymeric material, such as polybenzoxazole (PBO), polyimide (PI), benzocyclobutene (BCB), or the like. In other embodiments, the material of the dielectric layer 110D1 is or includes a nitride such as silicon nitride; an oxide such as silicon oxide, phosphosilicate glass (PSG), borosilicate glass (BSG), boron-doped phosphosilicate glass (BPSG), or the like; or the like. The dielectric layer 110D1 may be formed by any acceptable deposition process, such as spin coating, chemical vapor deposition (CVD), laminating, the like, or a combination thereof.

In some embodiments, referring to FIG. 1C, after the dielectric layer 110D1 is formed to cover the conductive pattern 110P1, openings 110VH1 are formed in the dielectric layer 110D1 to expose portions of the conductive pattern 110P1. For example, the dielectric layer 110D1 is patterned to form the openings 110VH1 to expose portions of the conductive pattern 110P1. In some embodiments, the dielectric layer 110D1 may be patterned by forming a photoresist pattern through photolithographic process and etching off the uncovered portions to form the openings 110VH1. In some embodiments, when the dielectric layer 110D1 is formed of a photosensitive polymeric material, the openings 110VH1 may be formed by performing exposure and development.

Later, referring to FIG. 1C, a conductive pattern 110P2 is formed together with the vias 110V1. For example, the conductive pattern 110P2 and the vias 110V1 may be formed by forming a metallic material layer (not shown) over the dielectric layer 110D1 and filling up the openings 110VH1 of the dielectric layer 110D1 and patterning the metallic material layer to form the conductive pattern 110P2 on the dielectric layer 110D1 and the vias 110V1 in the openings 110VH1. In some embodiments, the metallic material includes copper, titanium, nickel, tungsten, aluminum, a combination thereof. In some embodiments, the metallic material layer is formed by electroless plating, electroplating or deposition. Similarly, in some embodiments, the conductive pattern 110P2 include routing traces and pads. As described above, the conductive pattern 110P2 and the vias 110V1 may be formed from the same or similar materials, and a seed layer may be formed before forming the conductive pattern or vias, but the details will not be repeated herein. The conductive pattern 110P2 is electrically connected with the conductive pattern 110P1 through the vias 110V1. That is, the conductive vias 110V1 disposed in the openings 110VH1 of the dielectric layer 110D1 electrically connect the conductive patterns 110P1 and 110P2. In some embodiments, the conductive pattern 110P2 and the vias 110V1 may be formed separately.

Referring to FIG. 1C, the abovementioned process steps may be repeated multiple times such that a dielectric layer 110D2, a conductive pattern 110P3 and vias 110V2, a dielectric layer 110D3, and vias 110V3 are sequentially formed. In some embodiments, the materials of the conductive patterns 110P1-110P3 and the conductive vias 110V1-110V3 include copper, aluminum, nickel, titanium, tungsten, or a combination thereof. It is understood that the layers of the dielectric layers or the number of the conductive patterns and vias may be, for example, three (3) as shown in FIG. 1C. However, the numbers of these layers, patterns and vias are not limited thereto, and are not limited by the figures. As seen in FIG. 1C, a redistribution structure 110 is formed on the dielectric layer DI over the carrier C. In some embodiments, the redistribution structure 110 is referred to as a "backside redistribution structure" throughout the specification. The redistribution structure 110 includes the conductive patterns 110P1-110P3, the dielectric layers 110D1-110D3 and the conductive vias 110V1-110V3. Within the scopes of the present disclosure, the sequences of the process steps for forming the conductive patterns 110P1-110P3, the dielectric layers 110D1-110D3 and conductive vias 110V1-110V3 may be adjusted or exchanged.

After forming the redistribution structure 110, a plurality of metallic through vias 122 with seed patterns SL2 is formed on the redistribution structure 110. The formation of the metallic through vias 122 may involve forming a seed layer over the redistribution structure 110, forming a masking pattern (not shown) with openings on the seed layer, forming a metallic material over the redistribution structure 110 filling up openings, and then removing the masking pattern and extra seed layer. The locations of the metallic through vias 122 correspond to the locations of the vias 110V3. In FIG. 1C, the conductive vias 110V3 are formed with slant sidewalls and tapered in a direction away from the top surface of the redistribution structure 110. In some embodiments, the metallic material may be formed by electroplating, electroless plating, or the like. In some embodiments, the metallic material includes copper, titanium, nickel, tungsten, aluminum, or a combination thereof. For example, the metallic through vias 122 include copper pillars. In some embodiments, the seed pattern SL2 includes titanium and copper. In some alternative embodiments, the metallic through vias 122 may be pre-formed and connected to the conductive vias 110V3 of the redistribution structure 110, and there will be no seed patterns between the metallic through vias 122 and the vias 110V3. The seed pattern will not be illustrated in the following figures for simplicity.

Figure 1D:
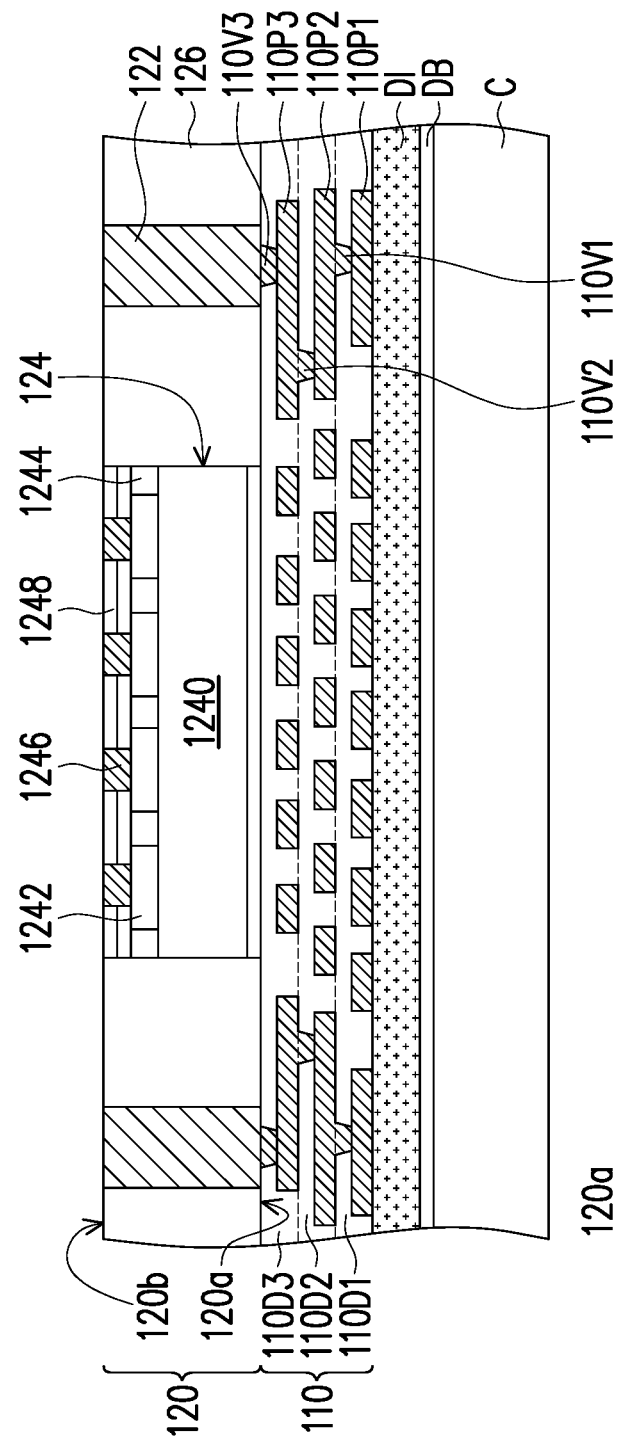

Referring to FIG. 1D, following the formation of the metallic through vias 122, semiconductor dies 124 (also referred to as semiconductor devices 124) are placed on the redistribution structure 110 over the carrier C. Herein, semiconductor dies and semiconductor devices may be used interchangeably. Later, the semiconductor devices 124 and the through vias 122 located on the redistribution structure 110 are encapsulated by an encapsulant 126. In some embodiments, the semiconductor devices 124 (only one semiconductor device 124 is shown in FIG. 1D, but the number of the semiconductor device 124 is not limited thereto) are provided and placed on the redistribution structure 110 and between the metallic through vias 122. In an embodiment, the semiconductor devices 124 may include different types of dies or devices performing different functions as one semiconductor device set. In some embodiments, the semiconductor device 124 may be attached to the redistribution structure 110 using, e.g., an adhesive material such as any suitable adhesive, epoxy, die attach film (DAF), or the like, although any suitable method of attachment may alternatively be utilized. In some embodiments, the metallic through vias 122 surround each set of the semiconductor devices 124. For example, the metallic through vias 122 are arranged as rows or columns or as rectangular rings surrounding each set of the semiconductor devices 124.

In some embodiments, the semiconductor device 124 includes a semiconductor substrate 1240, conductive pads 1242 formed on the semiconductor substrate 1240 and embedded in a passivation layer 1244, conductive posts 1246 formed on the conductive pads 1242 and a protection layer 1248 formed on the passivation layer 1244. In some embodiments, the semiconductor substrate 1240 may be a silicon substrate including active components (e.g., transistors or the like), passive components (e.g., resistors, capacitors, inductors or the like), and an interconnection structure for interconnecting the active and/or passive components. In some embodiments, the conductive pads 1242 include aluminum pads, copper pads or other suitable metal pads, and the conductive posts 1246 include copper posts or other suitable metal posts. In some embodiments, the passivation layer 1244 may be or include a silicon oxide layer, a silicon nitride layer, a silicon oxy-nitride layer or a dielectric layer formed by other suitable dielectric materials, while the protection layer 1248 includes a suitable polymeric material layer.

In some embodiments, the semiconductor devices 124 includes one or more devices selected from logic dies (e.g., central processing units, microcontrollers, etc.), memory dies (e.g., dynamic random access memory (DRAM) dies, static random access memory (SRAM) dies, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), and analog dies (e.g., analog front-end (AFE) dies). In some embodiments, the semiconductor devices 124 may include a system on chip (SoC) die and/or any suitable package units or sub-packages.

Referring to FIG. 1D, after disposing the semiconductor devices 124 onto the redistribution structure 110, the semiconductor devices 124 and the metallic through vias 122 on the redistribution structure 110 are covered by an encapsulant 126. In some embodiments, the encapsulant 126 is formed through a molding process such as transfer molding or compress molding. In some embodiments, the encapsulant 126 is formed over the redistribution structure 110 by over-molding to fully cover the through vias 122 and the semiconductor devices 124, and later a planarization process is performed to remove the extra encapsulant material to expose the tops of the metallic through vias 122 and the posts 1246. In some embodiments, the top surface of the encapsulant 126 is leveled and flush with the tops of the through vias 122 and the top surface of the semiconductor devices 124. In some embodiments, the encapsulant 126 laterally encapsulates (wraps) the semiconductor devices 124 and the through vias 122 (covers and surrounds the sidewalls of the semiconductor devices 124 and the through vias 122), and covers the redistribution structure 110. In some embodiments, the encapsulant 126 includes an insulating molding material such as epoxy resins, phenolic resins and fillers. In some embodiments, the metallic through vias 122 are through insulator vias or through molding vias. In some embodiments, the planarization process includes a mechanical grinding process or chemical mechanical polishing (CMP) process whereby chemical etchants and abrasives are utilized.

Throughout the description, after the encapsulant 126 is formed, the resultant structure including the through vias 122, the semiconductor devices 124, and the encapsulant 126 is referred to as an encapsulated semiconductor structure 120 in FIG. 1D, which may be formed in a wafer form or panel form. Accordingly, within the encapsulated semiconductor structure 120, the semiconductor devices 124 are disposed within die-placement regions, and the through vias 122 extending through the encapsulated semiconductor structure 120 (along the stacking direction or the thickness direction) are arranged outside but surrounding the die-placement regions.

In some embodiments, as seen in FIG. 1D, the encapsulated semiconductor structure 120 has a first surface 120a and a second surface 120b opposite to the first surface 120a. The first surface 120a of the encapsulated semiconductor structure 120 is in contact with a top surface of the redistribution structure 110.

Figure 1E:
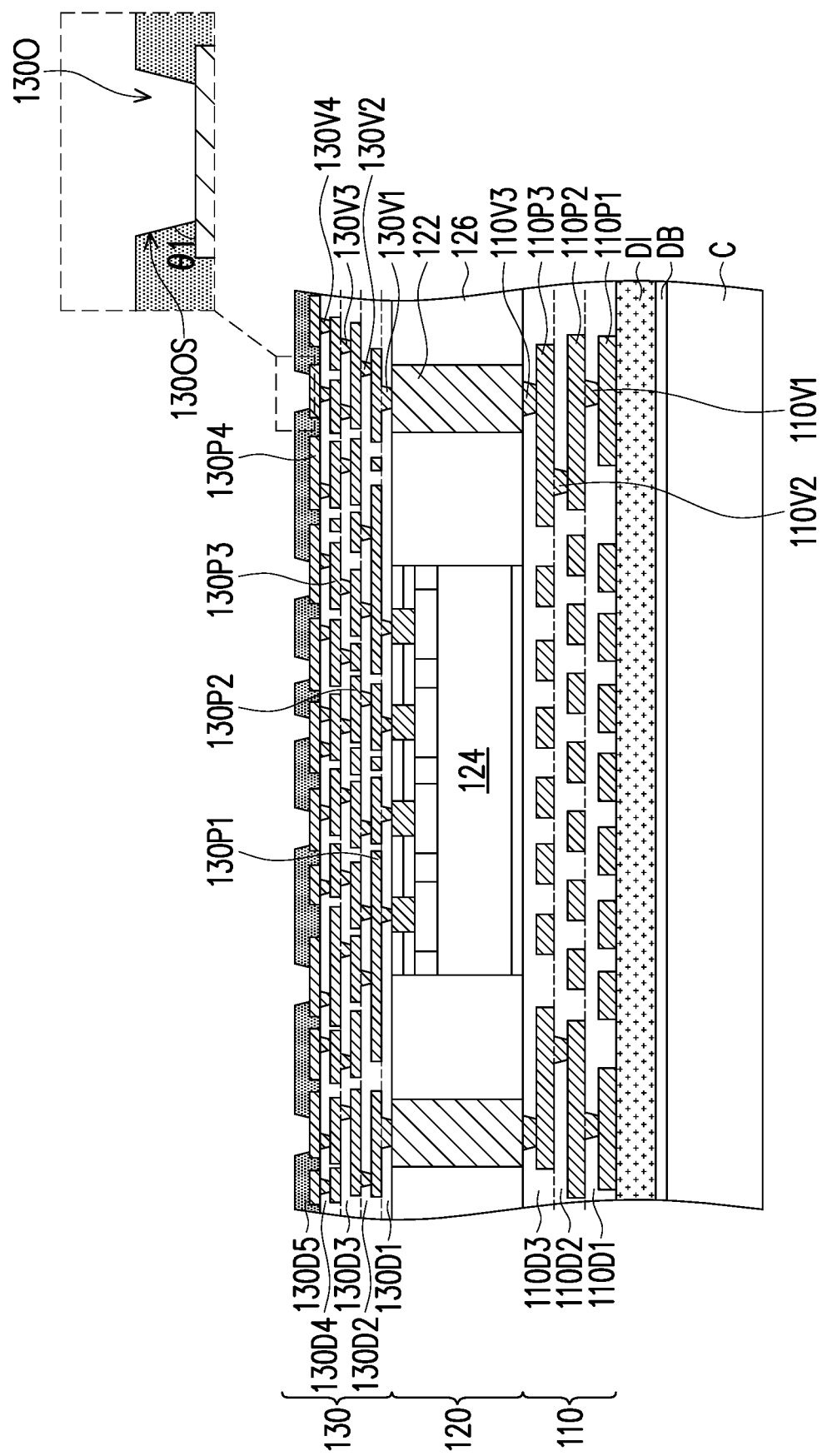

Referring to FIG. 1E, in some embodiments, a dielectric layer 130D1 is formed on the encapsulated semiconductor structure 120. In some embodiments, the dielectric layer 130D1 is formed of a polymer, such as, epoxy resins, polyimide (PI), polybenzoxazole (PBO), poly(p-phenylene oxide) (PPO), poly bismaleimide (BMI), bismaleimide triazine (BT) resins, benzocyclobutene (BCB), or the like. The dielectric layer 130D1 may be formed by any acceptable deposition process, such as spin coating, chemical vapor deposition (CVD), lamination, or a combination thereof.

In some embodiments, after the dielectric layer 130D1 is formed to cover the encapsulated semiconductor structure 120, openings are later formed in the dielectric layer 130D1 to expose portions of the metallic through vias 122 and the conductive posts 1246 of the semiconductor devices 124. For example, the dielectric layer 130D1 is patterned to form the openings to expose portions of the metallic through vias 122 and the conductive posts 1246 of the semiconductor devices 124. In some embodiments, the dielectric layer 130D1 may be patterned by any acceptable process, such as exposure to a light source and development when the dielectric layer 130D1 is formed of a photo-sensitive material. In some other embodiments, the patterning involves etching using, for example, an anisotropic etch. Later, another conductive pattern 130P1 is formed on the dielectric layer 130D1 and vias 130V1 are formed in the openings of the dielectric layer 130D1. The conductive pattern 130P1 and the vias 130V1 may be formed using the similar materials and following similar process steps as described for forming the conductive pattern 110P2 and the vias 110V1 respectively, and the details will not be repeated herein.

Later, the abovementioned process steps may be performed multiple times such that a dielectric layer 130D2, a conductive pattern 130P2, vias 130V2, a dielectric layer 130D3, a conductive pattern 130P3, vias 130V3, a dielectric layer 130D4, a conductive pattern 130P4, and vias 130V4 are sequentially formed. For example, the conductive pattern 130P2 is electrically connected with the conductive pattern 130P1 through the vias 130V2. That is, the conductive vias 130V2 disposed in the openings of the dielectric layer 130D2 electrically connect the conductive patterns 130P1 and 130P2. It is understood that the layers of the dielectric layers or the number of the conductive patterns and vias may be more or less than four.

Referring to FIG. 1E, after the formation of the conductive pattern 130P4, an alignment auxiliary layer 130D5 is formed to cover the conductive pattern 130P4 and is formed with openings 1300 exposing portions of the underlying conductive pattern 130P4, and the redistribution structure 130 is formed. In some embodiments, the redistribution structure 130 include at least one alignment auxiliary layer 130D5. In one embodiment, the alignment auxiliary layer 130D5 is the outermost layer of the redistribution structure 130.

As seen in FIG. 1E, the redistribution structure 130 may be referred to as the frontside redistribution structure and the redistribution structure 110 may be referred to as the backside redistribution structure. The semiconductor devices 124 in the encapsulated semiconductor structure 120 are further electrically connected to other components or devices through the double-sided redistribution structures 110 and 130. Referring to FIG. 1E, the redistribution structure 130 includes the conductive patterns 130P1-130P4, conductive vias 130V1-130V4, the dielectric layers 130D1-130D4 and the alignment auxiliary layer 130D5. Within the scopes of the present disclosure, the sequences of the process steps for forming the conductive patterns 130P1-130P4, conductive vias 130V1-130V4, the dielectric layers 130D1-130D4 and the alignment auxiliary layer 130D5 may be adjusted or exchanged.

In some embodiments, the alignment auxiliary layer 130D5 includes a colored dielectric layer, and the material of the alignment auxiliary 130D5 layer includes a photosensitive polymeric material, at least one photosensitive initiator (photo-initiator) and at least one dye. For example, the formation of the alignment auxiliary layer 130D5 involves providing a mixture containing monomers (or starting materials) of the photosensitive polymeric material, the photo-initiator and the dye, forming a pre-layer (not shown) using the mixture by coating or printing, performing an exposure process to the pre-layer to polymerize the mixture using light of a specific wavelength range in the exposed region (or unexposed region, depending on the properties of the photosensitive polymeric material), and later performing a development process to remove the unpolymerized mixture to form the alignment auxiliary layer 130D5. In some embodiments, the exposure process includes exposing predetermined regions of the pre-layer to the light through a mask or direct exposure selectively with a focused light beam. Through the exposure process upon the irradiation of the light of the specific wavelength, the photo-initiator absorbs the light and initiates the polymerization reaction, and the monomers are then polymerized to form the polymeric material (with the dye contained therein). In some embodiments, the exposure process includes using a light source, such as a mercury lamp, which is able to emit light irradiation at 436 nm (g-line), 405 nm (h-line) and 365 nm (i-line). In some embodiments, the exposure process includes using light with a wavelength of 365 nm (i-line). In some embodiments, after the exposure process and the development process, the pre-layer is patterned to form the alignment auxiliary layer 130D5 with the openings 130O. In some embodiments, the exposure process for forming the alignment auxiliary layer 130D5 with a light source using an energy (or energy dosage) larger than an energy (or energy dosage) of the light source of the exposure process for forming the dielectric layer 130D1 or other non-dyed dielectric layers 130D2-130D4. In some embodiments, the exposure process for the alignment auxiliary layer 130D5 uses light with a wavelength range of 400-440 nm or light of g-line/h-line with an energy dose larger than 3250 mJ. In some embodiments, the exposure process for the dielectric layer 130D1 or other non-dyed dielectric layers 130D2-130D4 may use light of i-line with an energy dose of about 150 mJ to about 300 mJ. In some embodiments, the exposure process for the dielectric layer 130D1 or other non-dyed dielectric layers 130D2-130D4 may use light with a wavelength range of about 360-440 nm light (or light of g-line/h-line/i-line) with an energy dose of about 275 mJ to about 445 mJ.

In some embodiments, the polymeric material may be or include epoxy resins, polyimide (PI), polybenzoxazole (PBO), poly(p-phenylene oxide) (PPO), poly bismaleimide (BMI), bismaleimide triazine (BT) resins, or the like. In some embodiments, the photo-initiator absorbs the light with a wavelength ranging from approximately 360 nm to approximately 440 nm. In some embodiments, the photo-initiator used for forming the alignment auxiliary layer 130D5 may be or include N-phenyldiethanolamine. In some embodiments, the photo-initiator used for the alignment auxiliary layer 130D5 may be or include phosphine oxide-based photo-initiators, such as 2,4,6-trimethylbenzoyldiphenylphosphine oxide

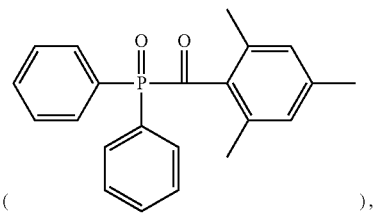 [SMILES: Cc1cc(C)c(C(=O)P(=O)(c2ccccc2)c2ccccc2)c(C)c1]

( ), or phenyl bis(2,4,6-trimethylbenzoyl)

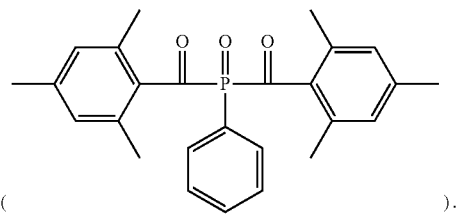

( ).

In some embodiments, the photo-initiator used for the alignment auxiliary layer 130D5 may be or include 2-aminoacetophenone

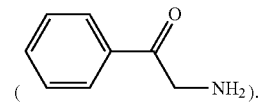

( ).

In some embodiments, the photo-initiator used for the alignment auxiliary layer 130D5 may be or include thioxanthone

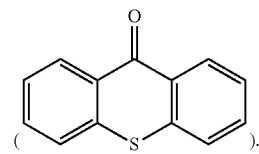

( ).

In some embodiments, the dye may be or include azo dye(s) or anthraquinone dye(s) or a mixture thereof. In some embodiments, the dye may be or include tetraazapentacene-based derivatives, anthracenedione-based derivatives, or a combination thereof. For example, the tetraazapentacene-based derivatives may include a tetraazapentacene core structure in which the N atom(s), or C atom(s) is substituted with one or more functional groups selected from amino groups, alkyl groups, aryl groups and alkylamino groups. In one embodiment, the dye includes a tetraazapentacene core structure in which the N atom(s), or C atom(s) is substituted with one or more functional groups selected from methyl groups, phenyl groups and phenylamino groups. For example, the anthracenedione-based derivatives may be anthracenedione substituted with one or more amino group (s). In one embodiment, the dye includes 1,4-diamino-2,3-diphenoxy-9,10-anthracenedione (also named as 1,4-diamino-2,3-bis-phenoxy-anthraquinone).

In some embodiments, the dye contained in the alignment auxiliary layer 130D5 absorbs the light and lowers the transmittance of the alignment auxiliary layer 130D5 to a certain degree so that the alignment auxiliary layer 130D5 can shield the light reflected by the underlying elements or parts, especially the conductive metallic patterns or routings, and assist the precise alignment in the subsequent processes. In some embodiments, under the light of a wavelength range of about 350-550 nm, the dye contained in the alignment auxiliary layer 130D5 absorbs the light, and the transmittance of the alignment auxiliary layer 130D5 is at least less than 50%. In some embodiments, under the light of a wavelength range of about 350-550 nm, the transmittance of the alignment auxiliary layer 130D5 may be less than 30% or less than 20%. In one embodiment, under the light of a wavelength range of about 350-550 nm, the transmittance of the alignment auxiliary layer 130D5 is less than 20% but larger than zero. In some embodiments, the alignment auxiliary layer 130D5 covering the underlying dielectric layers 130D1-130D4 has a transmittance smaller than that of any one layer of the dielectric layers 130D1-130D4.

In some embodiments, the content of the dye is approximately greater than zero and less than 1 wt % or about 0.1 wt % to about 0.8 wt %, based on a total weight of the mixture (as 100 wt %). In some embodiments, the content of the starting material or monomers of the polymeric material is approximately 20 wt % to 40 wt %, such as approximately 25 wt % to 35 wt %, based on the total weight of the mixture. In some embodiments, the content of the photosensitive initiator is approximately greater than zero and less than about 3 wt %, based on the total weight of the mixture.

In some embodiments, the redistribution structure includes at least one alignment auxiliary layer 130D5 containing at least one dye for shielding the reflective light to lower the brightness of the background. During the alignment of the surface mounted elements or components, the light reflected by the underlying metallization or metallic patterns stacked in the multilayered redistribution structure may cause bright background and interfere the surface mounting alignment, leading to mis-alignment and lower yield. By using the alignment auxiliary layer containing at least one dye for shielding the reflective light, the process window for the alignment is enlarged and precise alignment is achieved with better product yields. Furthermore, the alignment auxiliary layer 130D5 containing at least one dye offers high photosensitivity so that the pattern is formed in the alignment auxiliary layer 130D5 with a satisfactory high resolution.

In some embodiments, the openings 1300 formed in the alignment auxiliary layer 130D5 have sidewalls 1300S. As seen in the enlarged partial view shown at the upper right part of FIG. 1E, the sidewalls 1300S are slant sidewalls, there is an angle θ1 sandwiched between the sidewalls 1300S and the top surface of the conductive pattern 130P4, and the angle θ1 is about or larger than about 75 degrees and smaller than 90 degrees. In one embodiment, the angle θ1 sandwiched between the sidewalls 1300S and the top surface of the conductive pattern 130P4 is larger than about 80 degrees and smaller than about 90 degrees. In alternative embodiments, the openings 1300 formed in the alignment auxiliary layer 130D5 have substantially vertical sidewalls 1300S, and the angle θ1 is about 90 degrees. That is, the angle θ1 is either an acute angle (less than 90 degrees) or a right angle, but is not an obtuse angle. In some embodiments, as the alignment auxiliary layer 130D5 has high photosensitivity, the opening 1300S is formed with a smooth surface profile with a surface roughness (Ra) ranging from about 3 nm to about 10 nm. For example, the surface roughness is measured by Atomic Force Microscope (AFM), after a post descum process and before a plasma process.

Figure 1F:
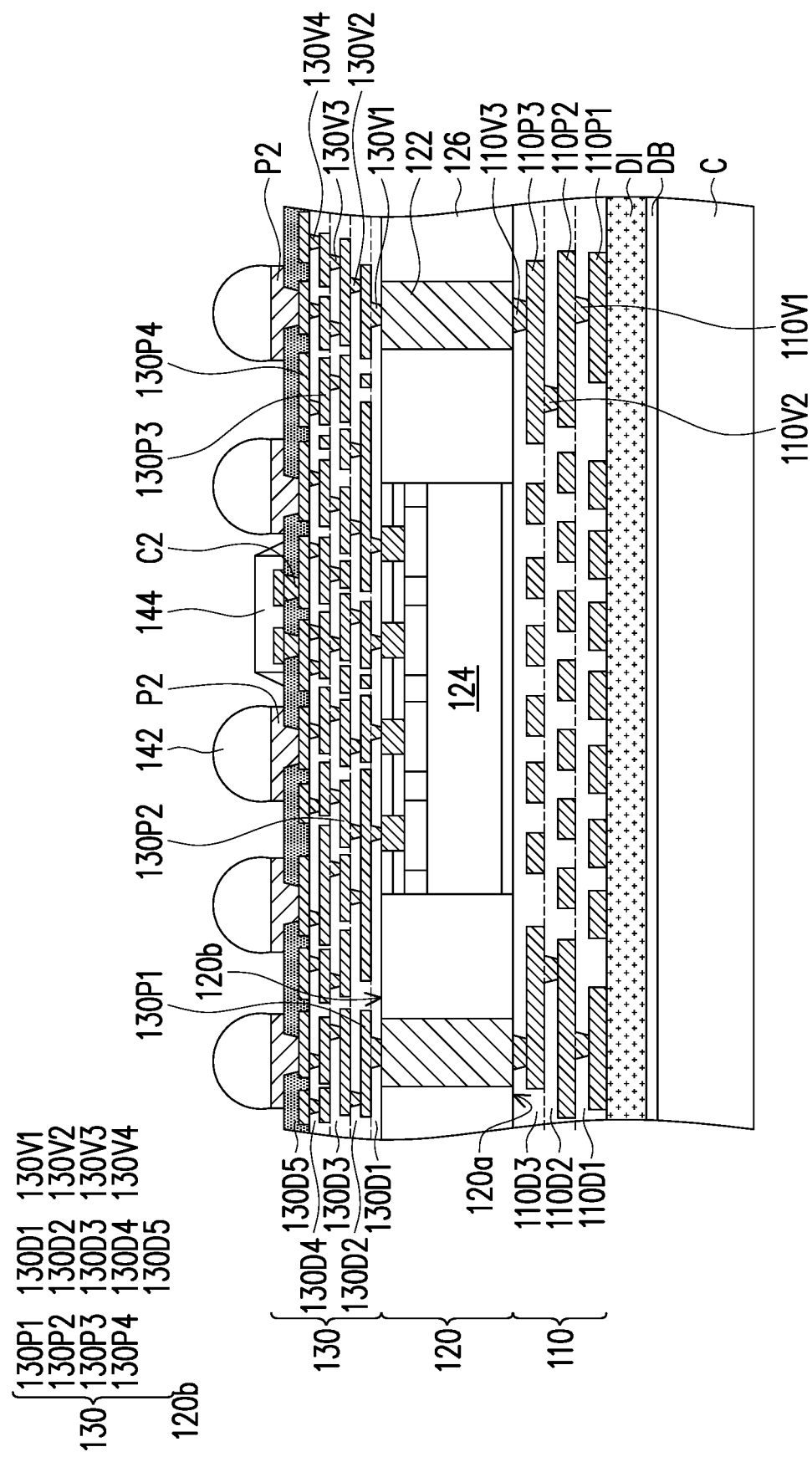

Referring to FIG. 1F, bump pads P2 and contact pads C2 are formed on the alignment auxiliary layer 130D5, covering, and filling the openings 1300 and in contact with the exposed conductive pattern 130P4. For example, the formation of the bumps pads P2 involves forming an under bump metallurgy (UBM) patterns on the alignment auxiliary layer 130D5 and within the openings 1300. In some embodiments, the conductive vias 130V1-130V4 may be tapered in a direction toward the second surface 120b of the encapsulated semiconductor structure 120.

As seen in FIG. 1F, after forming the bump pads P2 on the redistribution structure 130, bumps 142 are formed on the bump pads P2 on the redistribution structure 130. In some embodiments, at least one passive device 144 such as an integrated passive device (IPD) may also be disposed and bonded to the contact pads C2 on the redistribution structure 130. The formation of the bumps 142 may include placing solder balls on the connecting pads P2 (or on the redistribution structure 130), and then reflowing the solder balls. In some embodiments, the bumps 142 may be BGA connectors, solder balls, metal pillars, controlled collapse chip connection (C4) bumps, micro bumps, electroless nickel-electroless palladium-immersion gold technique (ENEPIG) formed bumps, or the like. The bumps 142 may include a conductive material such as solder, copper, aluminum, gold, nickel, silver, palladium, tin, the like, or a combination thereof. In some embodiments, the bumps 142 are formed by initially forming a layer of solder through such commonly used methods such as evaporation, electroplating, printing, solder transfer, ball placement, or the like. Once a layer of solder has been formed on the structure, a thermal process may be performed in order to shape the material into the desired bump shapes. In some embodiments, the passive device 144 includes resistors, capacitors, inductors, or the like. In some embodiments, the passive device 144 may be bonded and electrically connected to the redistribution structure 130 through, for example, flip-chip bonding.

Figure 1G:
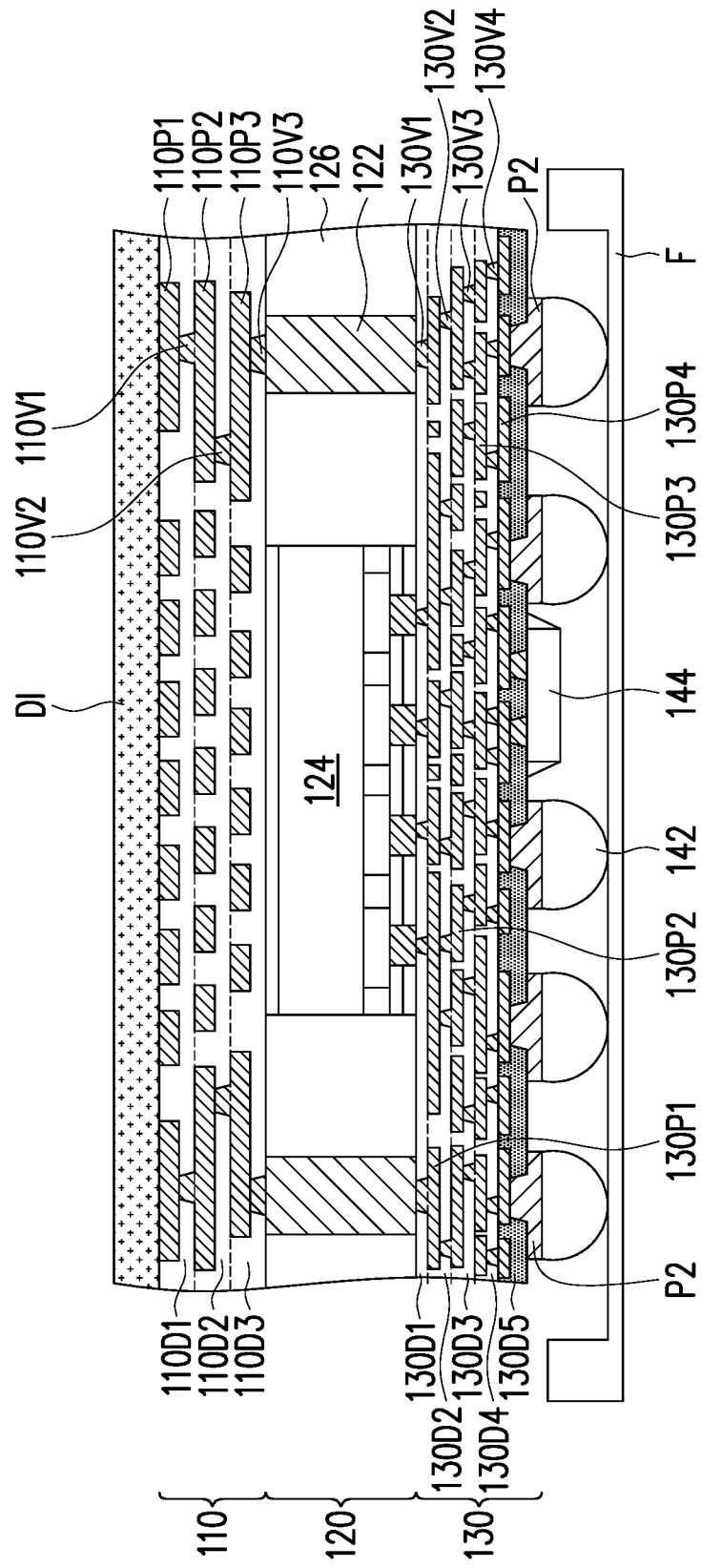

Referring to FIG. 1G, the structure shown in FIG. 1F with the carrier C is flipped over and disposed on a frame F. Then, the dielectric layer DI is de-bonded from the de-bonding layer DB such that the dielectric layer DI is separated from the carrier C. In some embodiments, the de-bonding layer DB (e.g., the LTHC release layer) may be irradiated by an UV laser such that the dielectric layer DI is peeled-off from the carrier C.

Figure 1H:
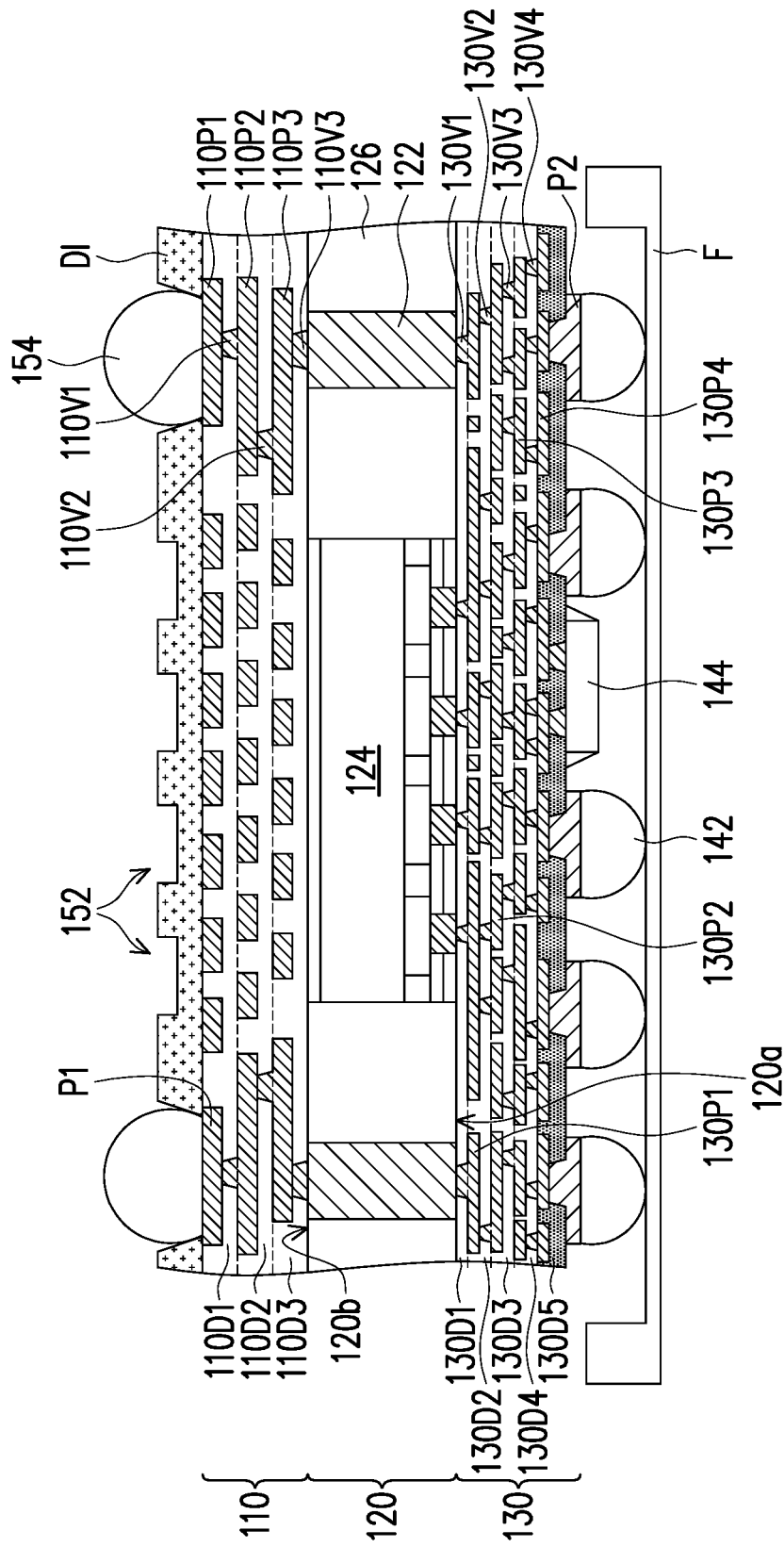
Figure 11:
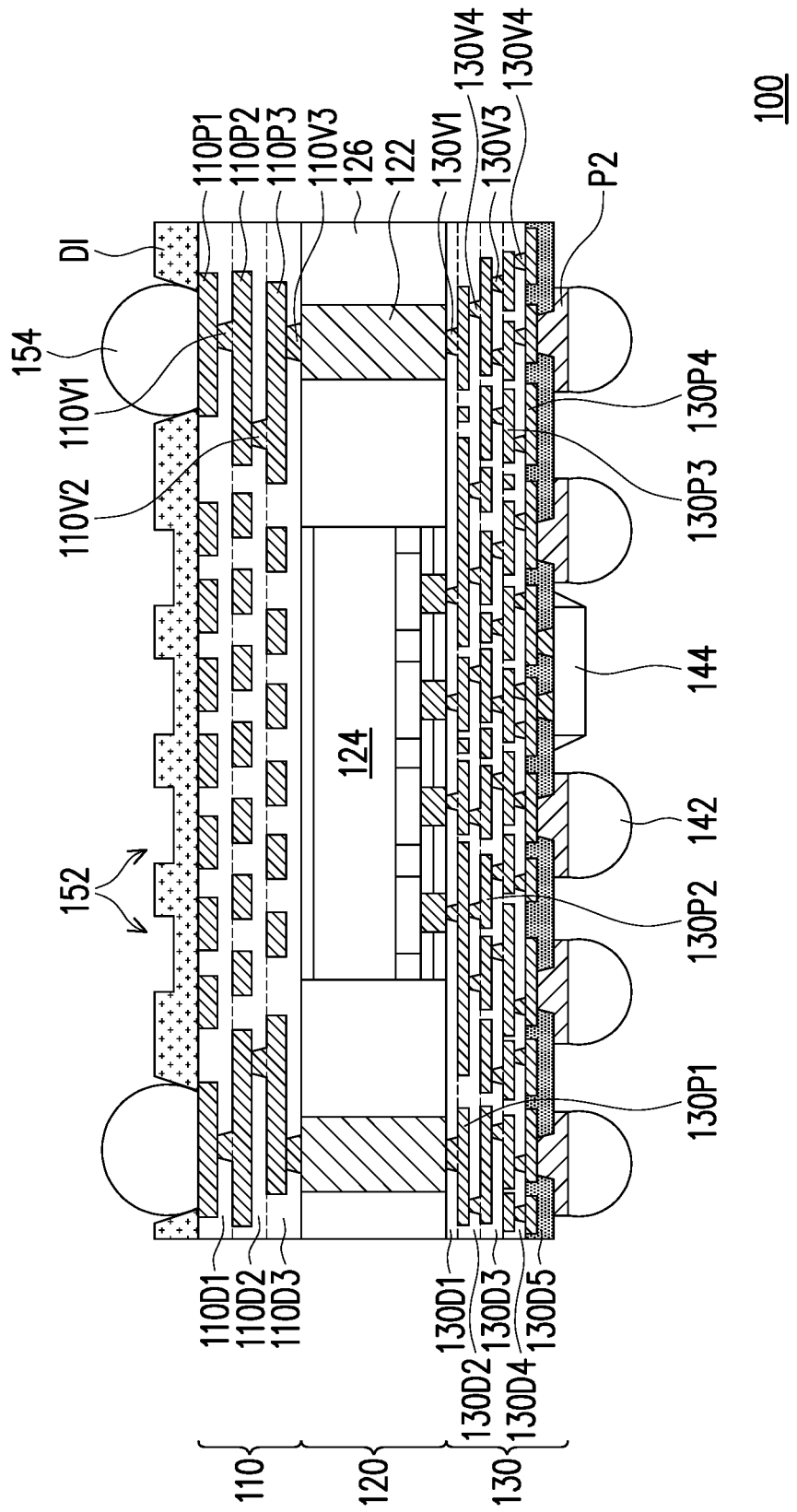

Referring to FIG. 1H, the dielectric layer DI is then patterned with openings to expose the pads P1 for receiving bumps 154, and bumps 154 are formed on the pads P1. In some embodiments, marking openings 152 are formed in the dielectric layer DI (also referred to as a marking dielectric layer) and aside the openings for the bumps 154. For example, the dielectric layer DI may be disposed on the first redistribution structure 110 at an opposite side of the first surface 120a of the encapsulated semiconductor structure 120. In some embodiments, the marking openings 152 are recesses or trenches without penetrating through the dielectric layer DI, and the marking openings 152 are used for product label marking and are not intended to accommodate electrical connection structures. In some embodiments, the marking openings 152 are formed by laser drilling.

In some embodiments, the marking dielectric layer DI has a transmittance lower than that of the dielectric layers 110D1-110D4. Compared with the alignment auxiliary layer 130D5, the marking dielectric layer DI has a transmittance about the same or even lower.

In some embodiments, referring to FIG. 1H, the bumps 154 may be placed on or formed on the connecting pads P1 of the redistribution structure 110 that are exposed by the bump openings. In embodiments, the bumps 154 may be BGA connectors, solder balls, metal pillars, C4 bumps, micro bumps, electroless nickel-electroless palladium-immersion gold technique (ENEPIG) formed bumps, or the like. The bumps 154 may include a conductive material such as solder, copper, aluminum, gold, nickel, silver, palladium, tin, the like, or a combination thereof. In some embodiments, the bumps 154 are formed by initially forming solder through such commonly used methods such as evaporation, electroplating, printing, solder transfer, ball placement, or the like. Once solder has been formed on the structure, a thermal process may be performed in order to shape the material into the desired bump shapes. In some embodiments, the bumps 154 have larger dimensions than those of the bumps 142. In some embodiments, the bumps 154 include solder bumps, and the bumps 142 include BGA connectors.

Referring to FIG. 1I, after forming the bumps 154, a singulation process is performed to cut the structure into individual packages 100, and the frame F is removed. The package 100 for example, is or includes an integrated fan-out (InFO) package. In some embodiments, the package 100 has dual-side redistribution structures as fan-out structures and connectors (such as bumps 142 and 154) as terminals for further electrical connection in subsequent processes.

Figure 2:
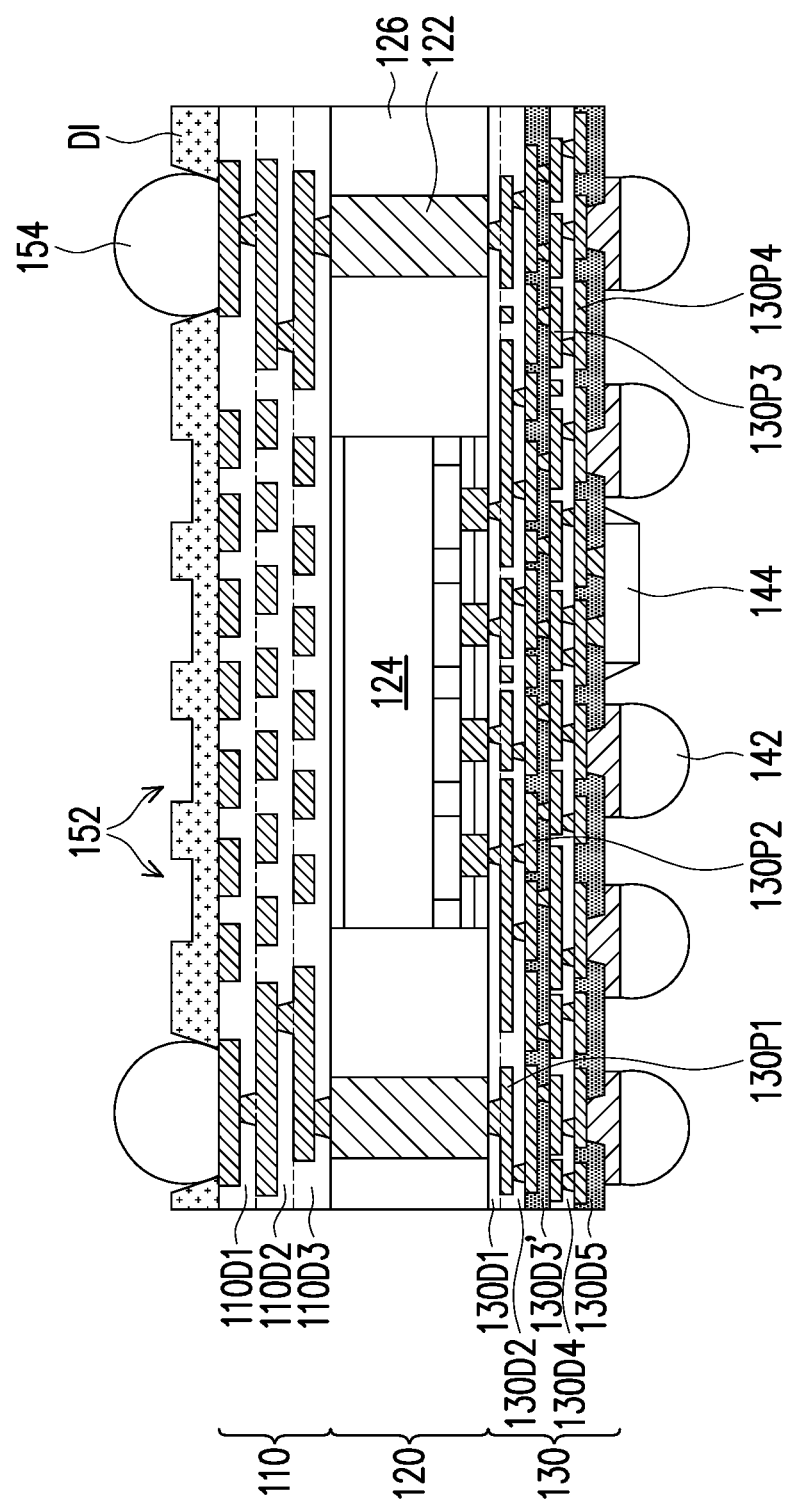
FIG. 2 is a schematic cross-sectional view of a semiconductor package in accordance with some embodiments of the present disclosure.

FIG. 2 is a schematic cross-sectional view of a semiconductor package in accordance with some embodiments of the present disclosure. The structure 200 shown in FIG. 2 is similar to the structure shown in FIG. 1I, and the same or similar materials and similar formation process steps may be used for forming the structure of FIG. 2. Similar or the same elements shown in FIG. 2 may be labeled with similar or the same reference labels or symbols, and the details of the elements labeled with the same reference symbols the same as FIG. 1A to FIG. 1I will not be repeated herein.

Referring to FIG. 2, the redistribution structure 130 is formed with an additional alignment auxiliary layer, for example, another alignment auxiliary layer (also a dielectric layer) 130D3' is formed of the process steps for forming the alignment auxiliary layer 130D5 as described above. In some embodiments, referring to FIG. 2, the redistribution structure 130 includes the conductive patterns 130P1-130P4, dielectric layers 130D1, 130D2 and 130D4 and the alignment auxiliary layers 130D3' and 130D5. In some embodiments, the alignment auxiliary layer 130D3' is formed and interposed between the dielectric layers 130D2 and 130D4, while the alignment auxiliary layer 130D5 is the outmost layer of the redistribution structure 130.

In other embodiments, either of the dielectric layers 130D1-130D4 shown in FIG. 1E may be replaced with the additional alignment auxiliary layer. That is, two or more (more than one) layers of the alignment auxiliary layer(s) may be formed in the redistribution structure, and the stacking sequence or relative stacking relationship of the alignment auxiliary layers may vary.

In some embodiments, the alignment auxiliary layers 130D3' and 130D5 may have the same transmittance under the light of the wavelength range of 350-550 nm. In some embodiments, the alignment auxiliary layers 130D3' and 130D5 may have different transmittance under the light of the wavelength range of 350-550 nm. Compared with other dielectric layers 130D1, 130D2 and 130D4 (without dye), the alignment auxiliary layers 130D3' and 130D5 have a transmittance lower than those of the non-dyed dielectric layers 130D1, 130D2 and 130D4. In some embodiments, the alignment auxiliary layer 130D3' has a transmittance less than 50% under the light of the wavelength range of 350-550 nm. In some embodiments, the alignment auxiliary layer 130D5 has a transmittance less than 50% under the light of the wavelength range of 350-550 nm. In some embodiments, under the light of the wavelength range of 350-550 nm, the alignment auxiliary layer 130D3' has a transmittance higher than a transmittance of the alignment auxiliary layer 130D5. In some embodiments, the alignment auxiliary layers 130D3' and 130D5 are formed using the same dye but with different contents of the dye. In some embodiments, the alignment auxiliary layer 130D3' has a dye content lower than a dye content of the alignment auxiliary layer 130D5. In some embodiments, the alignment auxiliary layer 130D3' contains a dye different from a dye contained in the alignment auxiliary layer 130D5, and the alignment auxiliary layer 130D3' has a transmittance higher than a transmittance of the alignment auxiliary layer 130D5 under the light of the wavelength range of 350-550 nm.

The low light transmittance of the additional alignment auxiliary layer also provides shielding effect to avoid light reflection from the underlying metallic patterns or wiring layers and to lower the brightness of the background, leading to better alignment for later surface mounted elements, component or sub-units.

Figure 3:
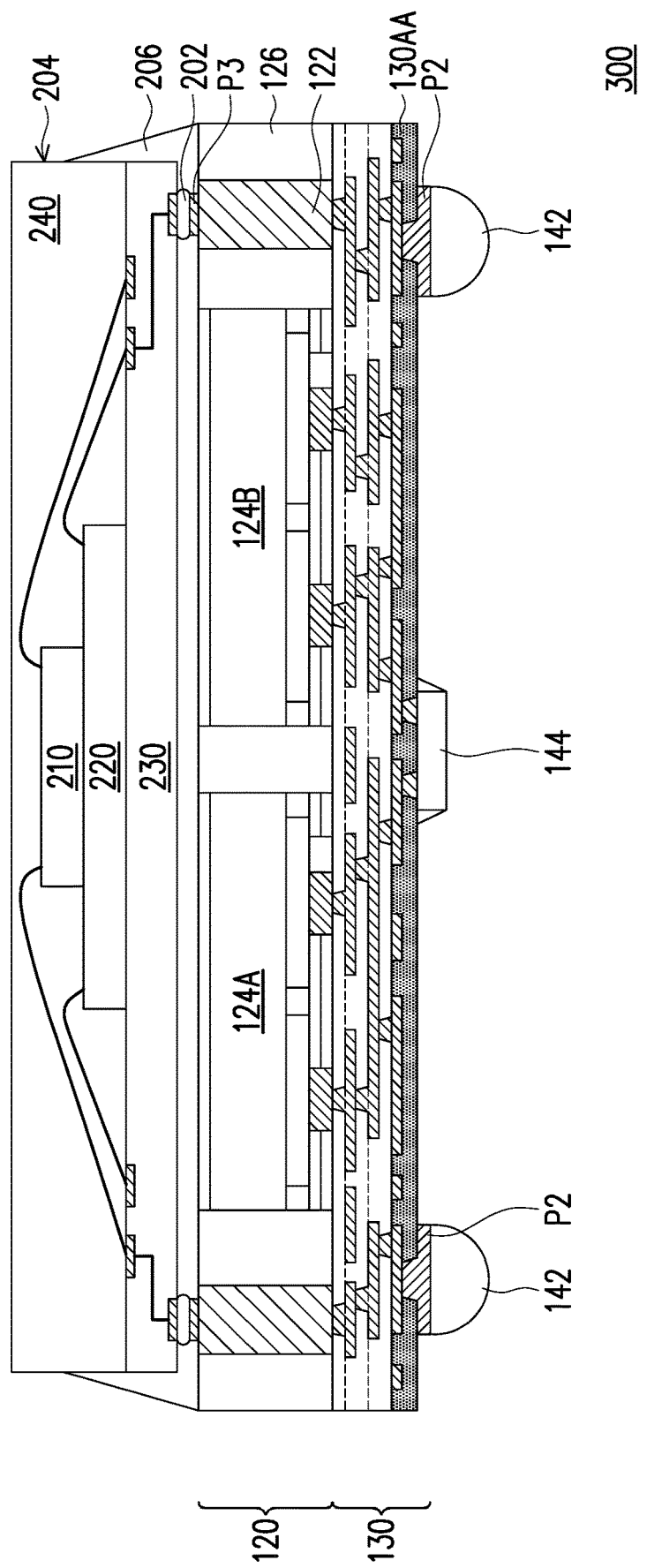
FIG. 3 is a schematic cross-sectional view of a semiconductor package in accordance with some embodiments of the present disclosure.

FIG. 3 is a schematic cross-sectional view of a semiconductor package in accordance with some embodiments of the present disclosure. The package structure 300 shown in FIG. 3 includes the redistribution structure 130 and the encapsulated semiconductor structure 120, and a package 204 disposed on the encapsulated semiconductor structure 120. The redistribution structure 130 and the encapsulated semiconductor structure 120 are similar to the parts shown in FIG. 1I, and the same or similar materials and similar formation process steps as described above may be used for forming the structure of FIG. 3. Similar or the same elements shown in FIG. 3 may be labeled with similar or the same reference labels or symbols, and the details of the elements labeled with the same reference or symbols as those labeled from FIG. 1A to FIG. 1I will not be repeated herein.

Referring to FIG. 3, the encapsulated semiconductor structure 120 includes semiconductor devices 124A and 124B arranged side-by-side, the metallic through vias 122 and the encapsulant 126. In some embodiments, the semiconductor devices 124A and 124B are similar to the semiconductor devices 120 as described above, but the semiconductor devices 124A and 124B are different types of dies and perform different functions. In some embodiments, the redistribution structure 130 is similar to the redistribution structure 130 as described above, except that less dielectric layers and conductive patterns are formed therein. Referring to FIG. 3, in some embodiments, the redistribution structure 130 includes an alignment auxiliary layer 130AA, which is the outermost dielectric layer of the redistribution structure 130. The alignment auxiliary layer 130AA is formed using the same or similar material(s) and similar process steps as described for forming the alignment auxiliary layer 130D5.

In some embodiments, the alignment auxiliary layer 130AA includes a colored dielectric layer, and the material of the alignment auxiliary layer 130AA include a photosensitive polymeric material and at least one dye. Compared with other dielectric layers (without containing dye therein) of the redistribution structure 130, the alignment auxiliary layer 130AA has a light transmittance lower than those of the non-dyed dielectric layers. In some embodiments, the alignment auxiliary layer 130AA has a transmittance less than 50% under the light of the wavelength range of 350-550 nm.

Referring to FIG. 3, in some embodiments, bumps 142 and a passive device 144 are formed on the bottom side of the redistribution structure 130, while the package structure 204 is disposed on the encapsulated semiconductor structure 120 and bonded to the through vias 122 through a plurality of electrical terminals 202. In some embodiments, the package structure 204 is a multi-chip stacked package including a substrate 230, a first chip 220 stacked on the substrate 230 and a second chip 210 stacked on the first chip 220. In some embodiments, the first and second chips 220, 210 are wire-bonded to the substrate 230 and are encapsulated by a molding compound 240. In some embodiments, the first and second chips 220, 210 are electrically connected with the semiconductor devices 124A and 124B through the substrate 230, the terminals 202, the through vias 122 and the redistribution structure 130. In an embodiment, the package structure 204 is electrically connected with the semiconductor devices 124A and 124B to work in conjunction.

In an embodiment, the first and second chips 220, 210 in the package structure 204 may include one or more logic chips or memory chips. In one embodiment, the first chip 220 includes a controller chip, and the second chip 210 includes a memory chip. In such an embodiment, the semiconductor device 124 may include a memory control module (not illustrated) that provides a control functionality to the memory device of the package structure 204 in addition to other functionalities provided by the semiconductor device 124. However, in some embodiments, the package structure 204 may include its own memory control module.

In some embodiments, the package structure 204 are mounted on the encapsulated semiconductor structure 120, and the electrical terminals 202 are aligned and bonded to the connecting pads P3. An underfill layer 206 is formed between the package structure 204 and the encapsulated semiconductor structure 120, encapsulating around the electrical terminals 202. In some embodiments, the underfill layer 206 is formed to cover and surround a portion of sidewalls of the package structure 204. In some embodiments, the underfill layer 206 includes epoxy resins. In some embodiments, the package 300 is a package-on-package (PoP) structure.

In accordance with some embodiments of the present disclosure, the semiconductor package has a redistribution layer including at least one alignment auxiliary layer. The alignment auxiliary layer is semi-opaque or translucent and has a transmittance lower than 50% under the light of the wavelength range of 350-550 nm. The alignment auxiliary layer is colored and includes at least one colorant or dye. With the alignment auxiliary layer formed within the redistribution structure, precise alignment for conductive terminals or bumps can be achieved. As the alignment auxiliary layer is semi-opaque, the interference or background noise caused by the underlying bright metallic patterns may be lessened or lowered, which significantly enlarges the alignment window and improves the production yields.

In accordance with some embodiments of the present disclosure, a semiconductor package is provided. The semiconductor package comprises a semiconductor die, an encapsulant laterally encapsulating the semiconductor die, and a redistribution structure disposed on the encapsulant and on the semiconductor die. The redistribution structure is electrically connected to the semiconductor die and includes an alignment auxiliary layer, a plurality of dielectric layers and a plurality of conductive patterns. The alignment auxiliary layer has a light transmittance for a light with a wavelength range of about 350-550 nm lower than that of one of the plurality of dielectric layers.

In accordance with some embodiments of the present disclosure, semiconductor package includes an encapsulated semiconductor structure, a first redistribution structure disposed on a first side of the encapsulated semiconductor structure and a second redistribution structure disposed on a second side of the encapsulated semiconductor structure opposite to the first side. The encapsulated semiconductor structure includes a semiconductor die, through vias disposed aside the semiconductor die and an encapsulant laterally encapsulating the through vias and the semiconductor die. The first redistribution structure is electrically connected to the semiconductor die and includes a plurality of first dielectric layers and a plurality of first conductive patterns stacked in alternation. The second redistribution structure is electrically connected to the semiconductor die and includes a plurality of second dielectric layers and a plurality of second conductive patterns stacked in alternation and an alignment auxiliary layer. The alignment auxiliary layer has a light transmittance for a light with a wavelength range of about 350-550 nm lower than those of the plurality of second dielectric layers, and the alignment auxiliary layer is an outermost layer of the second redistribution structure.

In accordance with some embodiments of the present disclosure, a method of forming a semiconductor package is provided. The semiconductor die is placed on a carrier. The semiconductor die is encapsulated with an encapsulant to form an encapsulated structure. A first dielectric layer is formed on the encapsulated structure and performing a first exposure process with a first exposure energy. A first conductive pattern is formed on the first dielectric layer. An alignment auxiliary layer is formed on the first conductive pattern and a second exposure process is performed with a second exposure energy. The second exposure energy is larger than the first exposure energy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a semiconductor die;
an encapsulant laterally encapsulating the semiconductor die; and
a redistribution structure, disposed on the encapsulant and on the semiconductor die, and electrically connected to the semiconductor die, wherein the redistribution structure includes an alignment auxiliary layer, a plurality of dielectric layers and a plurality of conductive patterns, wherein the alignment auxiliary layer has a light transmittance for a light with a wavelength range of about 350-550 nm lower than that of one of the plurality of dielectric layers.

2. The semiconductor package of claim 1, wherein a material of the alignment auxiliary layer includes a dye with a light absorbance for the light with the wavelength range of about 350-550 nm, and the light transmittance of the alignment auxiliary layer for the light of the wavelength range of about 350-550 nm is lower than 50%.

3. The semiconductor package of claim 2, wherein a content of the dye is greater than zero and less than 1 wt %, based on a total weight of the material of the alignment auxiliary layer.

4. The semiconductor package of claim 2, wherein the dye includes an azo dye or an anthraquinone dye.

5. The semiconductor package of claim 1, wherein the alignment auxiliary layer is stacked on the plurality of dielectric layers and is an outermost layer of the redistribution structure.

6. The semiconductor package of claim 5, wherein the alignment auxiliary layer further comprises an opening exposing a topmost conductive pattern of the plurality of conductive patterns, and an angle between a sidewall of the opening and a top surface of the topmost conductive pattern is an acute angle or a right angle.

7. The semiconductor package of claim 6, wherein the sidewall of the opening has a surface roughness of about 3 nm to about 10 nm.

8. The semiconductor package of claim 1, wherein the redistribution structure further comprises an additional alignment auxiliary layer located between the semiconductor die and the auxiliary layer.

9. A semiconductor package, comprising:
an encapsulated semiconductor structure including a semiconductor die, through vias disposed aside the semiconductor die and an encapsulant laterally encapsulating the through vias and the semiconductor die;
a first redistribution structure, disposed on a first side of the encapsulated semiconductor structure, and electrically connected to the semiconductor die, wherein the first redistribution structure includes a plurality of first dielectric layers and a plurality of first conductive patterns stacked in alternation; and
a second redistribution structure, disposed on a second side of the encapsulated semiconductor structure opposite to the first side, and electrically connected to the semiconductor die, wherein the second redistribution structure includes a plurality of second dielectric layers and a plurality of second conductive patterns stacked in alternation and an alignment auxiliary layer, and
wherein the alignment auxiliary layer has a light transmittance for a light with a wavelength range of about 350-550 nm lower than those of the plurality of second dielectric layers, and the alignment auxiliary layer is an outermost layer of the second redistribution structure.

10. The semiconductor package of claim 9, wherein the alignment auxiliary layer includes a dye with light absorption for the light with the wavelength range of about 350-550 nm, and a content of the dye is greater than zero and less than 1 wt %, based on a total weight of the alignment auxiliary layer.

11. The semiconductor package of claim 10, wherein the dye includes an azo dye or an anthraquinone dye, and the light transmittance of the alignment auxiliary layer is lower than 50% for the light with the wavelength range of about 350-550 nm.

12. The semiconductor package of claim 9, wherein the alignment auxiliary layer is stacked on the plurality of second dielectric layers, the alignment auxiliary layer has an opening exposing an underlying conductive pattern of the plurality of second conductive patterns, and an angle between a sidewall of the opening and a top surface of the underlying conductive pattern is an acute angle or a right angle.

13. The semiconductor package of claim 9, further comprising a passive device mounted on the second redistribution structure.

14. The semiconductor package of claim 9, wherein the first redistribution structure includes a marking dielectric layer, and the marking dielectric layer has a light transmittance lower than those of the plurality of first dielectric layers for the light with the wavelength range of about 350-550 nm.

15. The semiconductor package of claim 14, wherein the light transmittance of the alignment auxiliary layer is about the same as that of the marking dielectric layer.

16. The semiconductor package of claim 14, wherein the marking dielectric layer has a plurality of marking recesses.

17. A semiconductor package, comprising:
a semiconductor die;
an encapsulant laterally encapsulating the semiconductor die; and
a redistribution structure, disposed on the encapsulant and on the semiconductor die, and electrically connected to the semiconductor die,
wherein the redistribution structure comprises an alignment auxiliary layer being an outermost layer of the redistribution structure, and
the alignment auxiliary layer comprises a dye with light absorption for a light with a wavelength range of about 350-550 nm.

18. The semiconductor package of claim 17, wherein a light transmittance of the alignment auxiliary layer for the light of the wavelength range of about 350-550 nm is lower than 50%.

19. The semiconductor package of claim 17, wherein the redistribution structure further comprises a plurality of dielectric layers disposed below the alignment auxiliary layer, and
wherein the alignment auxiliary layer has a light transmittance for the light with the wavelength range of about 350-550 nm lower than that of one of the plurality of dielectric layers.

20. The semiconductor package of claim 17, wherein the alignment auxiliary layer further comprises a photo-initiator including a phosphine oxide-based photo-initiator.

* * * * *